US008266195B2

(12) United States Patent
Taleb et al.

(10) Patent No.: US 8,266,195 B2
(45) Date of Patent: Sep. 11, 2012

(54) FILTER ADAPTIVE FREQUENCY RESOLUTION

(75) Inventors: Anisse Taleb, Kista (SE); Harald Pobloth, Täby (SE); Erlendur Karlsson, Uppsala (SE); Erik Norvell, Stockholm (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 975 days.

(21) Appl. No.: 12/295,110

(22) PCT Filed: Mar. 28, 2007

(86) PCT No.: PCT/SE2007/000299
§ 371 (c)(1),
(2), (4) Date: Nov. 10, 2008

(87) PCT Pub. No.: WO2007/111560
PCT Pub. Date: Oct. 4, 2007

(65) Prior Publication Data
US 2009/0172060 A1    Jul. 2, 2009

Related U.S. Application Data

(60) Provisional application No. 60/743,872, filed on Mar. 28, 2006.

(51) Int. Cl.
*G06F 17/10* (2006.01)

(52) U.S. Cl. ........................................ 708/300; 708/321
(58) Field of Classification Search .................. 708/300, 708/313, 321
See application file for complete search history.

(56) References Cited

U.S. PATENT DOCUMENTS

| 4,841,828 A | 6/1989 | Suzuki | |
|---|---|---|---|
| 5,255,215 A * | 10/1993 | Sakata et al. | 708/322 |
| 7,072,429 B1 * | 7/2006 | Sogo | 375/350 |
| 2002/0046227 A1 * | 4/2002 | Goszewski et al. | 708/313 |
| 2004/0187672 A1 * | 9/2004 | Ito | 84/626 |
| 2006/0088091 A1 | 4/2006 | Jeon | |

FOREIGN PATENT DOCUMENTS

WO    WO 2006046188 A1    5/2006

* cited by examiner

*Primary Examiner* — Chuong D Ngo

(57) ABSTRACT

In signal processing using digital filtering the representation of a filter is adapted depending on the filter characteristics If e.g. a digital filter is represented by filter coefficients for transform bands Nos. $0, 1, \ldots, K$ in the frequency domain, a reduced digital filter having coefficients for combined transform bands, i.e. subsets of the transformed bands, Nos. $0, 1, \ldots, L$, is formed and only these coefficients are stored. When the actual filtering in the digital filter is to be performed, an actual digital filter is obtained by expanding the coefficients of the reduced digital filter according to a mapping table and then used instead of the original digital filter.

22 Claims, 14 Drawing Sheets

FILTER ADAPTIVE FREQUENCY RESOLUTION

RELATED APPLICATIONS

This application claims priority and benefit from U.S. provisional patent application No. 60/743,872 filed Mar. 28, 2006, the entire teachings of which are incorporated herein by reference. In the present application embodiments are briefly described and discussed which are described in the pending International patent application No. PCT/SE2007/000006, "Personalized Decoding of Multi-Channel Surround Sound", filed Jan. 5, 2007, which is also incorporated herein by reference.

TECHNICAL FIELD

The present invention is related to digital filtering of an input digital signal and in particular the handling of filter coefficients in representations of digital filters.

BACKGROUND

In digital signal processing, filters are typically represented by and stored as series or sets of filter coefficients. These coefficients may in turn represent e.g. the sampled impulse response of the filter in either the time or frequency domain or the coefficients of a difference equation such as $$y[t] = \sum_{n=0}^{N_b} b_n x[t-n] - \sum_{n=0}^{N_a} a_n y[t-n] \quad (1)$$

where t is the index of the time sample, y is the output of the filter, x is its input, and a and b are the sets of coefficients representing the filter. In the case where the filter is represented by its impulse response, the number of coefficients stored is dependent on which block length is necessary to describe the impulse response of the filter. In the other case where the coefficients in the difference equation (Eq. (1)) are used the number of coefficients is determined by the filter order. It should be noted that for FIR filters (all $a_n=0$), the time domain impulse response coincides with the coefficients $b_n$. One application where filters represented by the frequency domain impulse response are stored and used and where the current invention is useful is the binaural decoding of surround sound.

In film theaters around the world, multi-channel surround audio systems have since long placed film audiences in the center of the audio spaces of the film scenes that are being played before them and are giving them a realistic and convincing feeling of "being there". This audio technology has moved into the homes of ordinary people as home surround sound theatre systems and is now providing them with the sense of "being there" in their own living rooms.

The next field where this audio technology will be used includes mobile wireless units or terminals, in particular small units such as cellular telephones and PDAs (Personal Digital Assistants). There the immersive nature of the surround sound is even more important because of the small sizes of the displays. Moving this technology to mobile units is, however, not a trivial matter. The main obstacles include that:

1. The available bit-rate is in many cases low in wireless mobile channels.
2. The processing power of mobile terminals is often limited.
3. Small mobile terminals generally have only two micro speakers and earplugs or headphones.

This means, in particular for mobile terminals such as cellular telephones, that a surround sound solution for a mobile terminal has to use a much lower bit rate than the 384 kbits/s used in the Dolby Digital 5.1 system. Due to the limited processing power, the decoders of the mobile terminals must be computationally optimized and due to the speaker configuration of the mobile terminal, the surround sound must be delivered through the earplugs or headphones.

A standard way of delivering multi-channel surround sound through headphones or earplugs is to perform a 3D audio or binaural rendering of each of the speaker signals.

In general, in 3D audio rendering a model of the audio scene is used and each incoming monophonic signal is filtered through a set of filters that model the transformations created by the human head, torso and ears. These filters are called head related filters (HRFs) having head related transfer functions (HRTFs) and if appropriately designed, they give a good 3D audio scene perception.

The diagram of FIG. 1 illustrates a method of complete 3D audio rendering of an audio signal according to a 5.1 surround system. The six multi-channel signals according to the 5.1 surround system are:
surround right (SR),
right (R),
center (C),
low frequency (LFE),
left (L)
surround left (SL).

In the example illustrated in FIG. 1 the center and low frequency signals are combined into one signal. Since the acoustics for the left and the right side are assumed to be symmetric, the head related filtering can be implemented using five different filters $H_I^B$, $H_C^B$, $H^C$, $H_I^F$ and $H_C^F$. Seen from one side of the head, these filters model the acoustics for sound arriving from speakers located on the same side (ipsilateral) and opposite side (contralateral) of the head, here denoted by the subscript indices I and C. These dimensions are combined with the origin on the medial axis (front or back), giving the superscript indices F and B. The sound located in the center of the audio scene is modeled with the filter $H_C^B$.

The quality in terms of 3D perception of such rendering depends on how closely the HRFs model or represent the listener's own head related filtering when she/he is listening. Hence, it may be advantageous if the HRFs can be adapted and personalized for each listener if a good or very good quality is desired. This adaptation and personalization step may include modeling, measurement and in general a user dependent tuning in order to refine the quality of the perceived 3D audio scene.

Current state-of-the-art standardized multi-channel audio codecs require a high amount of bandwidth or a high bit-rate in order to reach an acceptable quality, and thus they prohibit the use of such codecs for services such as wireless mobile streaming.

For instance, even if the Dolby Digital 5.1 codec (AC-3 codes) has a very low complexity when compared to an AAC multi-channel codec, it requires a much higher bit-rate for similar quality. Both codecs, the AAC multi-channel codec and the AC-3 codec, remain until today unusable in the wireless mobile domain because of the high demands that they make on computational complexity and bitrate.

New parametric multi-channel codecs based on the principles of binaural cue coding have been developed. The recently standardized parametric stereo tool is a good example of the low complexity/high quality parametric technique for encoding stereophonic sound. The extension of parametric stereo to multi-channel coding is currently under standardization in MPEG under the name Spatial Audio coding, and is also known as MPEG-surround.

The principles of parametric multi-channel coding can be explained and understood from the block diagram of FIG. 2 that illustrates a general case. A parametric surround encoder 3, also called a multi-channel parametric surround encoder, receives a multichannel, composite audio signal comprising the individual signals $x_1(n)$ to $x_N(n)$, where N is the number of input channels. For a 5.1 surround system N=6 as stated above. The encoder 3 then forms in a down-mixing unit 5 a composite down-mixed signal comprising the individual down-mixed signals $z_1(n)$ to $z_M(n)$. The number M of down-mixed channels (M<N) is dependent upon the required or allowable maximum bit-rate, the required quality and the availability of an M-channel audio encoder 7. One key aspect of the encoding process is that the down-mixed composite signal, typically a stereo signal but it could also be a mono signal, is derived from the multi-channel input signal, and it is this down-mixed composite signal that is compressed in the audio encoder 7 for transmission over the channel 11 rather than the original multi-channel signal. The parametric encoder 3 and in particular the down-mixing unit 5 thereof may be capable of performing a down-mixing process, such that it creates a more or less true equivalent of the multi-channel signal in the mono or stereo domain. The parametric surround encoder also comprises a spatial parameter estimation unit 9 that from the input signals $x_1(n)$ to $x_N(n)$ computes the cues or spatial parameters that in some way can be said to describe the down-mixing process or the assumptions made therein. The compressed audio signal which is output from the M-channel audio encoder and also is the main signal is together with the spatial parameters that constitute side information transmitted over an interface 11 such as a wireless interface to the receiving side that in the case considered here typically is a mobile terminal.

Alternatively, the down-mixing could be supplied by some external unit, such as from a unit employing Artistic Downmix.

On the receiving side, a complementary parametric surround decoder 13 includes an audio decoder 15 and should be constructed to be capable of creating the best possible multi-channel decoding based on knowledge of the down-mixing algorithm used on the transmitting side and the encoded spatial parameters or cues that are received in parallel to the compressed multi-channel signal. The audio decoder 15 produces signals $\hat{z}_1(n)$ to $\hat{z}_M(n)$ that should be as similar as possible to the signals $z_1(n)$ to $z_M(n)$ on the transmitting side. These are together with the spatial parameters input to a spatial synthesis unit 17 that produces output signals $\hat{x}_1(n)$ to $\hat{x}_N(n)$ that should be as similar as possible to the original input signals $x_1(n)$ to $x_N(n)$ on the transmitting side. The output signals $\hat{x}_1(n)$ to $\hat{x}_N(n)$ can be input to a binaural rendering system such as that shown in FIG. 1.

It is obvious, that depending on the bandwidth of the transmitting channel over the interface 11 that generally is relatively low there will be a loss of information and hence the signals $\hat{z}_1(n)$ to $\hat{z}_M(n)$ and $\hat{x}_1(n)$ to $\hat{x}_N(n)$ on the receiving side cannot be the same as their counterparts on the transmitting side. Even though they are not quite true equivalents of their counter parts, they may be sufficiently good equivalents perceptually.

In general, such a surround encoding process is independent of the compression algorithm used for the transmitted channels used in the units audio encoder 7 and audio decoder 15 in FIG. 2. The encoding process can use any of a number of high-performance compression algorithms such as AMR-WB+, MPEG-1 Layer III, MPEG-4 AAC or MPEG-4 High Efficiency AAC, or it could even use PCM.

In general, the above operations are done in the transformed signal domain, the transform used being e.g. the Fourier transform or MDCT. This is especially beneficial if the spatial parameter estimation and synthesis in the units 9 and 17 use the same type of transform as that used in the audio encoder 7, also called core codec.

FIG. 3 is a detailed block diagram of an efficient parametric audio encoder. The N-channel discrete time input signal, denoted in vector form as $x_N(n)$, is first transformed to the frequency domain in a transform unit 21, and in general to a transform domain that gives a signal $\bar{x}_N(k,m)$. The index k is the index of the transform coefficients, or sub-bands if a frequency domain transform is chosen. The index m represents the decimated time domain index that is also related to the input signal possibly through overlapped frames.

The signal is thereafter down-mixed in a down-mixing unit 5 to generate the M-channel downmix signal $z_M(k,m)$, where M<N. A sequence of spatial model parameter vectors $p_N(k,m)$ is estimated in an estimation unit 9. This can be either done in an open-loop or closed loop fashion.

Spatial parameters consist of psycho-acoustical cues that are representative of the surround sound sensation. For instance, in an MPEG surround encoder, these parameters consist of inter-channel differences in level, phase and coherence equivalent to the ILD, ITD and IC cues to capture the spatial image of a multi-channel audio signal relative to a transmitted down-mixed signal $z_M(k,m)$, or if in closed loop, the decoded signal $\tilde{z}_M(k,m)$. The cues $p_N(k,m)$ can be encoded in a very compact form such as in a spatial parameter quantization unit 23 producing the signal $\hat{p}_N(k,m)$ followed by a spatial parameter encoder 25. The M-channel audio encoder 7 produces the main bitstream which in a multiplexer 27 is multiplexed with the spatial side information produced by the parameter encoder. From the multiplexer the multiplexed signal is transmitted to a demultiplexer 29 on the receiving side in which the side information and the main bitstream are recovered as seen in the block diagram of FIG. 4.

On the receiving side the main bitstream is decoded to synthesize a high quality multichannel representation using the received spatial parameters. The main bitstream is first decoded in an M-channel audio decoder 31 from which the decoded signals $\hat{z}_M(k,m)$ are input to the spatial synthesis unit 17. The spatial side information holding the spatial parameters is extracted by the demultiplexer 29 and provided to a spatial parameter decoder 33 that produces the decoded parameters $\hat{p}_N(k,m)$ and transmits them to the synthesis unit 17. The spatial synthesis unit produces the signal $\bar{x}_N(k,m)$, that is provided to the signal F/T transform unit 35 transforming it into the time domain to produce the signal $\hat{x}_N(n)$, i.e. the multichannel decoded signal.

A 3D audio rendering of a multi-channel surround sound can be delivered to a mobile terminal user by using an efficient parametric surround decoder to first obtain the multiple surround sound channels, using for instance the multi-channel decoder described above with reference to FIG. 4. Thereupon, the system illustrated in FIG. 1 is used to synthesize a binaural 3D-audio rendered multichannel signal. This operation is shown in the schematic of FIG. 5.

Alternatively, a more efficient binaural decoder as described in International patent application No. PCT/SE2007/000006, "Personalized Decoding of Multi-Channel Surround Sound", filed Jan. 5, 2007, can be used. The operation of this binaural decoder is summarized below.

The processing in an MPEG surround decoder can be defined by two matrix multiplications as illustrated in the diagram of FIG. 15, the multiplications shown as including matrix units M1 and M2, also called the predecorrelator matrix unit and the mix matrix unit, respectively, to which the respective signals are input. The first matrix multiplication forms the input signals to decorrelation units or decorrelators $D_1, D_2, \ldots$, and the second matrix multiplication forms the output signals based on the down-mix input and the output from the decorrelators. The above operations are done for each hybrid subband, indexed by the hybrid subband index k.

In the following, the index n is used for a number of a time slot, k is used to index a hybrid subband, and l is used to index the parameter set. The processing of the input channels to form the output channels can then be described as:

$$v^{n,k} = M_1^{n,k} x^{n,k} \quad (2)$$

$$y^{n,k} = M_2^{n,k} w^{n,k} \quad (3)$$

where $M_1^{n,k}$ is a two-dimensional matrix mapping a certain number of input channels to a certain number of channels going into the decorrelators, and is defined for every time-slot n and every hybrid subband k, and $M_2^{n,k}$ is a two-dimensional matrix mapping a certain number of pre-processed channels to a certain number of output channels and is defined for every time-slot n and every hybrid subband k. The matrix $M_2^{n,k}$ comes in two versions depending on whether time-domain temporal shaping (TP) or temporal envelope shaping (TES) of the decorrelated signal is used, the two versions denoted $M_{2\_wet}^{n,k}$ and $M_{2\_dry}^{n,k}$. Both matrices $M_1^{n,k}$ and $M_2^{n,k}$ are derived using the binaural parameters transmitted to the decoder. The derivation of $M_1^{n,k}$ and $M_2^{n,k}$ is described in further detail in ISO/EC 14496-3:200 X/PDAM 4, MPEG Surround N7530, October 2005, Nice, France.

The input vector $x^{n,k}$ to the first matrix unit M1 corresponds to the decoded signals $\hat{z}_M(k,m)$ of FIG. 4 obtained from the M-channel audio decoder 31. The vector $w^{n,k}$ that is input to the mix matrix unit M2 is a combination of the output $d_1, d_2, \ldots$ from the decorrelators $D_1, D_2, \ldots$, the output from first matrix multiplication, i.e. from the predecorrelator matrix unit $M_1$, and residual signals $res_1, res_2, \ldots$, and is defined for every time-slot n and every hybrid subband k. The output vector $y^{n,k}$ has components $l_f, l_s, r_f, r_s$, cf and lfe that basically correspond to the signals L, SL, R, SR, C and LFE as described above. The components must be transformed to the time domain and in some way be rendered to be provided to the used earphones, i.e. they cannot be directly used.

A method for 3D audio rendering uses a decoder that includes a "Reconstruct from Model" block that takes extra input such as a representation of the personal HRFs and other rendering parameters in the hybrid filter-bank domain, compare items 43, 37 and 17' of FIG. 14, and uses it to transform derivatives of the model parameters to other model parameters that allows generating the two binaural signals directly in the transform domain, so that only the binaural 2-channel signal has to be transformed into the discrete time domain, such as in the transform unit 35 of FIG. 14 that illustrates personalized binaural decoding based on the MPEG surround.

A third matrix $M_3^{n,k}$, symbolically shown as the parameter modification matrix M3 in FIG. 16, is in this example a linear mapping from 6 channels to two channels, which are used as input to the user headphones 39 through the transform unit 35. The matrix multiplication can be written as $$(r,l) = M_3^{n,k} y^{n,k} \quad (4)$$

By linearity (the associative law) it is clear that the matrices $M_2^{n,k}$ and $M_3^{n,k}$ can be combined together to form a new set of parameters stored in a new mix matrix $M_4^{n,k} = M_3^{n,k} M_2^{n,k}$. This combining operation is illustrated in FIG. 17, where the multiplication unit corresponding to the new matrix is shown as the mix matrix unit M4 and the multiplication of the two matrices is made in a multiplying unit 45.

The new mix matrix $M_4^{n,k}$ has parameters that depend both on the bit-stream parameters and the user predefined head related filters HRFs and as well on other dynamic rendering parameters if desired.

For the case of head related filters only, the matrix $M_3^{n,k}$ can be written as $$M_3^{n,k} = \begin{bmatrix} H_C^F(k) & H_C^B(k) & H_I^F(k) & H_I^B(k) & H^C(k) & H^C(k) \\ H_I^F(k) & H_I^B(k) & H_C^F(k) & H_C^B(k) & H^C(k) & H^C(k) \end{bmatrix} \quad (5)$$

the matrix elements being the five different filters which are used to implement the head related filtering and as above are denoted $H_I^B, H_C^B, H_I^F, H_C^F$ and $H_C^F$. In the system of FIG. 15 the filters are represented in the hybrid domain. Such operations of transforming a representation of filters from the time domain to the frequency or transform domain are well known in the signal processing literature. Here the filters that form the matrix $M_3^{n,k}$ are functions of the hybrid subband index k and are similar to those illustrated in FIG. 1. This is further detailed in FIG. 17. First the spatial parameters represented in the 20 spatial parameter bands are used to generate the matrix $M_{2p}^{n,j}$, the mixing matrix in the parameter band domain. Then, the mapping function given in Table A.30 of the above cited ISO/EC document is used to map the parameter subband indices to the hybrid subband indices k to generate $M_2^{n,k}$. The resulting mixing matrix is multiplied with $M_3^{n,k}$ and from the result the final mixing matrix $M_4^{n,k}$ is generated.

It should be noted that for this simple case the matrix $M_3^{n,k}$ is independent of the time slot index n. Head related filters might also be changed dynamically if the user wants another virtual loudspeaker configuration to be experienced through the headphones 39.

From the discussion above it is obvious that an efficient handling of digital filters and their coefficients can be advantageous in some cases, e.g. for applications where there are limited resources for processing and/or storing such as in mobile telephones.

SUMMARY

It is an object of the invention to provide a method and a device for digital filtering, in particular for efficient handling of filter coefficients in digital filters.

Generally, the representation of a filter may be efficiently adapted depending on the filter characteristics.

Furthermore, the representation of the filter may be adaptively tuned in order to fulfill a fidelity criterion.

The representation of the filter may also be adaptively tuned in order to fulfill a complexity criterion.

Furthermore, the frequency resolution of a filter may be efficiently adapted depending on its frequency response in case the filter is represented by its frequency domain impulse response.

For binaural surround decoding, a concept of binaural processing bands may be applied which is used as an intermediate frequency resolution in order to perform efficient and high quality binaural rendering.

The binaural parameter bands resolution is adaptively tuned to fulfill either quality or complexity requirements.

In particular, the frequency resolution of a filter representation can be adapted to the frequency response of that filter. The underlying rationale is that the frequency response of a filter can be close to constant for a certain frequency range. This frequency range is then represented by one single coefficient. Thus, the amount of storage space required for a filter is reduced. In addition, identical multiplications are avoided when combining filter responses with similar properties. One possible embodiment is to analyze the variance of the filter response in pre-defined frequency bands and split bands having high variances into two bands. The method may be useful when e.g. applying and storing head-related filter transfer functions.

In one general aspect an input signal can be processed using the conventional steps of providing the input signal to a digital filter represented by a set of filter coefficients and filtering the input signal by the digital filter. Before the actual step of filtering, the filter coefficients are expanded from a reduced digital filter represented by and stored as reduced filter coefficients and corresponding to some original digital filter. Then, at least one of the reduced filter coefficients corresponds to or substantially agrees with two of the filter coefficients in the original digital filter. The reduced digital filter can be obtained by comparing the filter coefficients of the original digital filter to each other and combining, according to the result of the comparing, filter coefficients that are equal to each other or are sufficiently close to each other, to subsets of filter coefficients. Each such subset may typically be a frequency band and is represented by a reduced filter coefficient obtained from the filter coefficients in the subset, such as by some averaging operation.

The original digital filter can be a product of a plurality of element original digital filters. Then, in the comparing operation, the filter coefficients of each of the element digital filters are compared to each other and in the step of combining, filter coefficients of each of the element digital filters that are equal to each other or are sufficiently close to each other are combined to subsets. As for the simple case, each such subset represented by a reduced filter coefficient obtained from the filter coefficients in the subset. The subsets of the sets of filter coefficients for all element digital filters are also selected so that they are equal to each other, i.e. all the sets of filter coefficients of the element digital filter are divided in subsets in the same way.

A device for processing an input signal can then generally include a memory place for storing reduced filter coefficients of a reduced digital filter, a memory place for storing a table mapping the reduced filter coefficients to filter coefficients of an original digital filter and logical unit for expanding the reduced filter coefficients to form actual filter coefficients that are equal to or substantially agrees with the filter coefficients of the original digital filter, and a filtering unit for filtering the input signal using the actual filter coefficients.

In another aspect, filter coefficients are stored that represent an original digital filter that is in turn represented by original filter coefficients. In the storing operation, the original filter coefficients are compared to each other and combined, according to the result of the comparing, filter coefficients that are equal to each other or are sufficiently close to each other, to subsets of filter coefficients as described above. Finally the reduced filter coefficients are stored and also a table mapping the subsets to the original filter coefficients is determined and stored.

Additional objects and advantages of the invention will be set forth in the description which follows, and in part will be obvious from the description, or may be learned by practice of the invention. The objects and advantages of the invention may be realized and obtained by means of the methods, processes, instrumentalities and combinations particularly pointed out in the appended claims.

BRIEF DESCRIPTION OF THE DRAWINGS

While the novel features of the invention are set forth with particularly in the appended claims, a complete understanding of the invention, both as to organization and content, and of the above and other features thereof may be gained from and the invention will be better appreciated from a consideration of the following detailed description of non-limiting embodiments presented hereinbelow with reference to the accompanying drawings, in which:

DETAILED DESCRIPTION

Methods and systems will now be described in which the resolution of a filter representation is adaptive to the filter response at hand. This is particularly interesting in cases where an application faces different filter responses either at startup or during its operation. An example of filter responses that can vary between consecutive application setups are the head related filters having head related transfer functions (HRTF) that are individual to each user of the algorithm. If the HRTFs are to be stored and combined with other filter responses, the storage format and the number of coefficients in the HRTFs are adaptive to the variance in them.

Generally, a signal processing system is considered in which a time-domain input signal x[t] (signal amplitude as function of time t) is transformed into the frequency domain. Hence, T samples of the time-domain input signal x[t] (taken at times $t_1, t_2, \ldots, t_T$) are transformed to K frequency domain samples X[k]. Then, a filter having the time-domain impulse response h[t] is applied to the transformed signal by multiplying the frequency-domain impulse response H[k] of the filter by the transformed signal X[k] to obtain a filtered frequency-domain signal Y[k]:

$$Y[k]=X[k]H[k] \tag{6}$$

Figure 6:
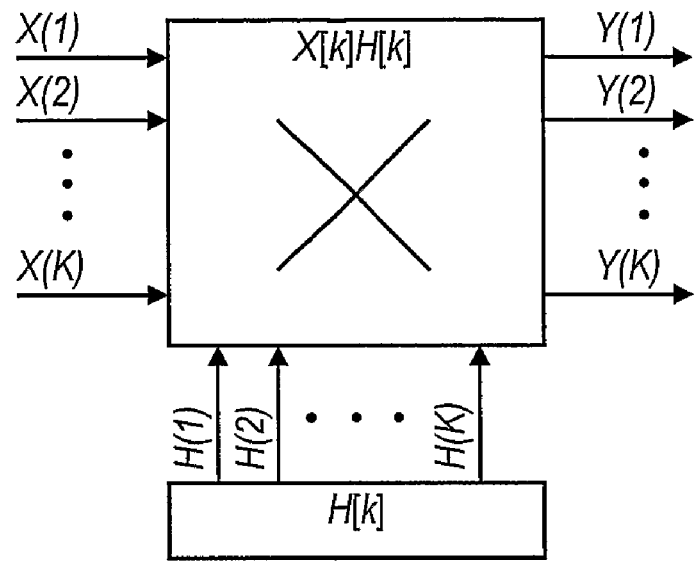
FIG. 6 is a schematic illustrating vector multiplication of a frequency-domain signal by a filter impulse response.
Figure 7:
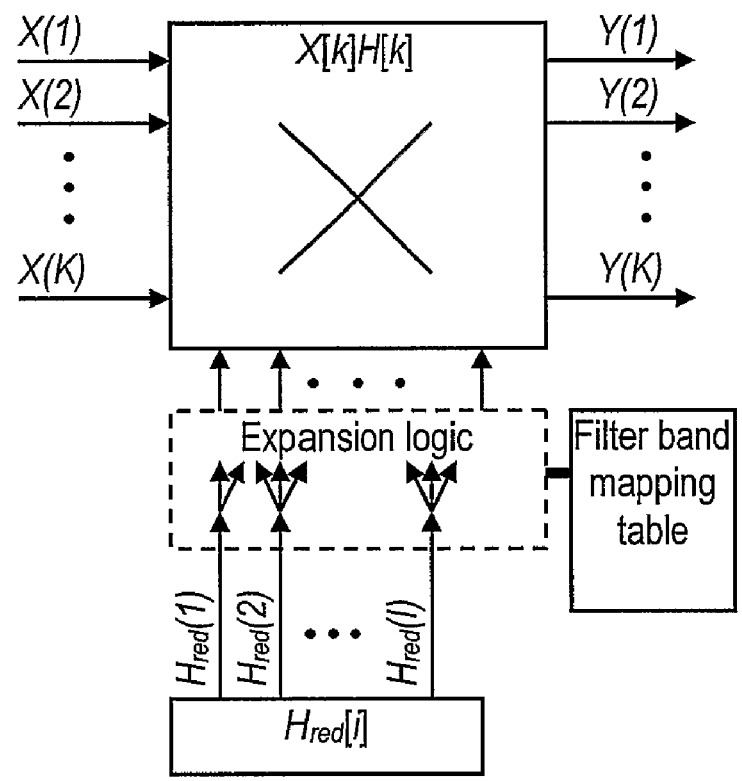
FIG. 7 is similar to FIG. 6 but illustrating the multiplication when a filter impulse response reduced to filter bands is used.

This operation is illustrated in FIG. 6. In this case the resolution K of the transform used for transforming into the frequency domain determines, i.e. is equal to, the number of filter coefficients. If some of the filter coefficients in the frequency-domain impulse response H[k] are equivalent or close to equivalent to each other it should be sufficient to store only one representative of such equivalent coefficients, see FIG. 7. The frequency band spanned by this representative can be denoted a filter band. In the case where the filter coefficients in one filter band are not exactly equivalent, a suitable representative may be derived by, e.g., minimizing an error criterion or by some suitable averaging operation, as will be described below.

Figure 8:
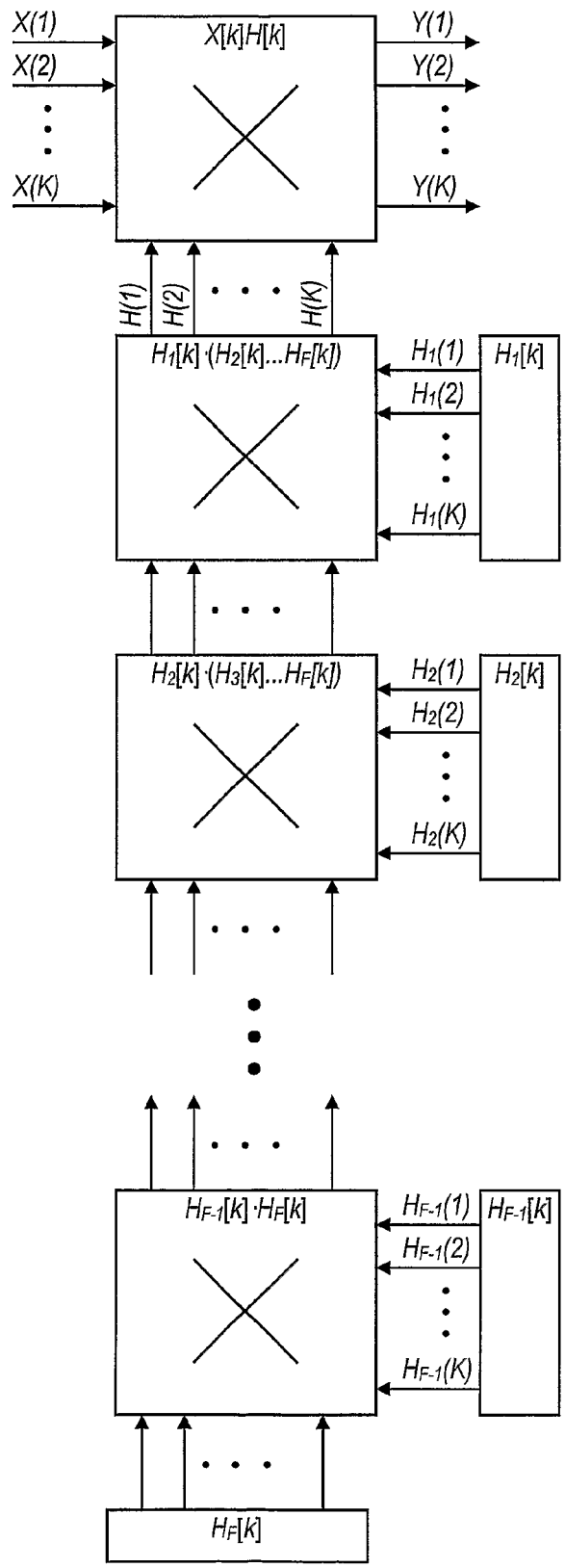
FIG. 8 is similar to FIG. 6 illustrating the case where the filter impulse response is derived from cascaded filters.

In the case of F serially connected, independent filters, i.e. a cascade of F filters, having the respective frequency-domain impulse responses $H_1[k], H_2[k], \ldots, H_F[k]$ are considered, the resulting overall frequency domain impulse response H[k] is obtained by vector multiplication operations as given by, see also FIG. 8:

$$H[k]=H_1[k]H_2[k] \ldots H_F[k]. \tag{7}$$

Figure 11:
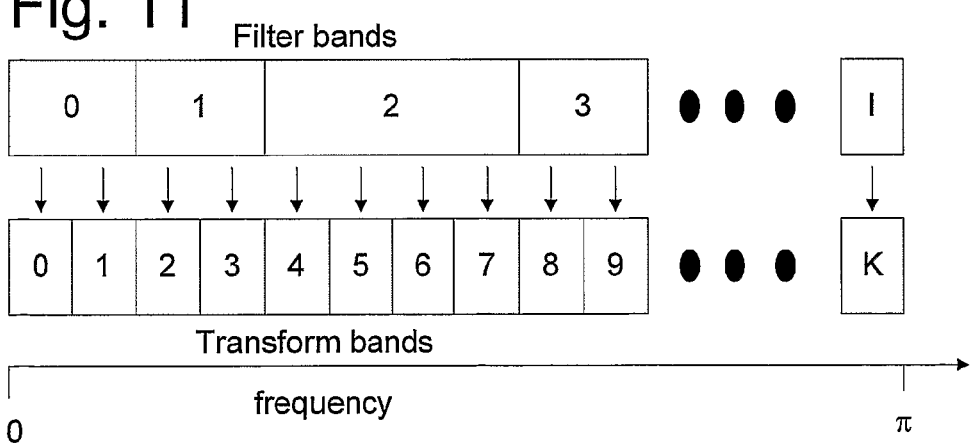
FIG. 11 is a schematic of an example mapping from K transform bands to I filter bands.

If all these cascaded filters are constant or close to constant in some frequency regions, the number of multiplications needed to derive the overall filter frequency-domain impulse response H[k] can be reduced from F·K to F·I, where I is the number of frequency bands needed to represent the filter responses $H_I$ to $H_F$ and I<K. This corresponds to a complexity and storage reduction by a factor K/I. An example mapping from K transform bands to I filter bands is illustrated in FIG. 11 where each of the filter bands spans at least two transform bands. The vertical arrows indicate the mapping from filter bands to transform bands.

Figure 9:
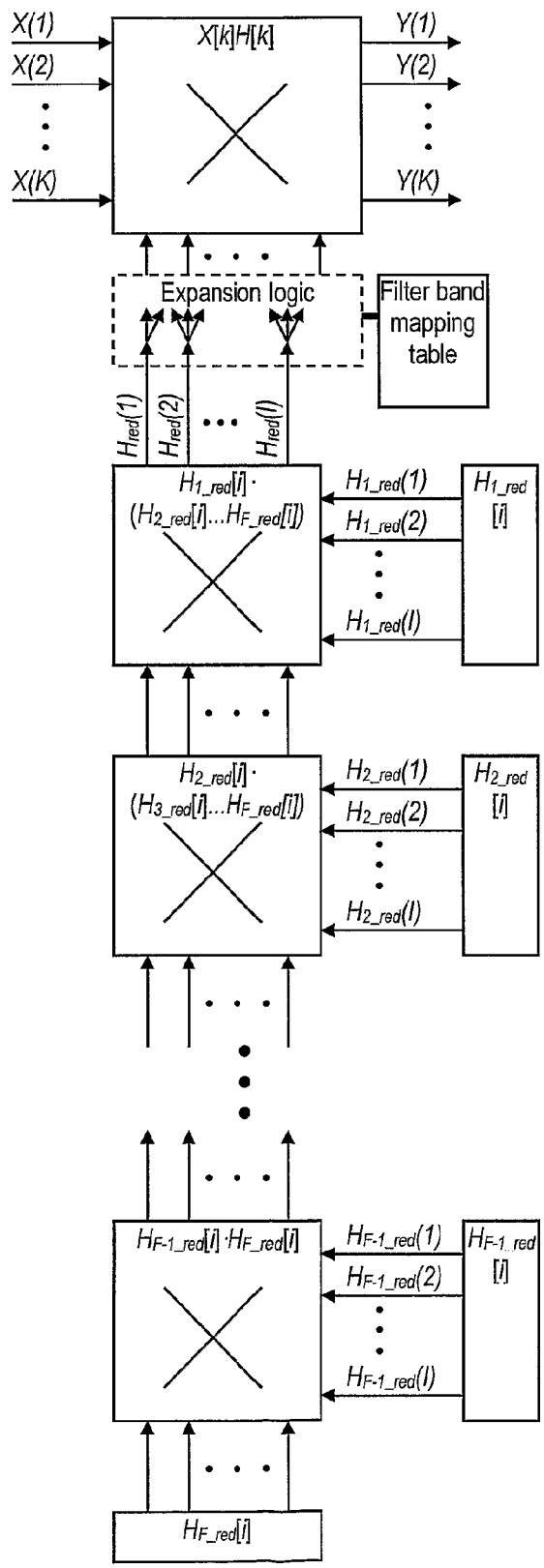
FIG. 9 is similar to FIG. 8 but illustrating the multiplications required when filter impulse responses reduced to filter bands are used for the cascaded filters.

After the reduction, new filter responses $H_{1\_red}[i], H_{2\_red}[i], \ldots, H_{F\_red}[i]$ are obtained, where i ranges from 1 to I, see FIG. 9, where the multiplication in Eq. (7) is illustrated. A reduction to filter bands requires additional logic, represented by the box "Expansion logic" in FIGS. 7 and 9, that can give an increased complexity, and also a table of the mapping from filter bands to transform bands, that can give an increased requirement of memory space in some simple cases. However, if a multitude of cascaded filters are provided, an overall reduction of complexity and requirement of memory space may be achieved.

The method as described herein includes two main features:
Adaptive frequency resolution of filters for filter storage and calculation.
A method for finding bands representing a filter response.
An example of an iterative algorithm to adaptively find a desired number I of filter bands given a filter response H[k], k=1, 2, . . . , K is outlined in the following steps, see also the flow-chart of FIG. 10:
1. Initialize the number I of filter bands to be equal to one, the initial filter band spanning the entire frequency range, see step 101 of flow-chart.
2. Find in step 103 of flow-chart the variance $\sigma^2[i]$ of the filter response H[k] in all filter bands:

$$\sigma^2[i] = \frac{1}{K_i}\sum_{k \in B_i} H^2[k] - \frac{1}{K_i^2}\left(\sum_{k \in B_i} H[k]\right)^2$$

where $B_i$ is the set of all transform bands k mapping to filter band i and $K_i$ is the size of $B_i$.
3. Split in the next step 105 of flow-chart the filter band i where the variance $\sigma^2[i]$ is largest in two parts and increase I by one in step 107 of flow-chart.
4. Repeat steps 2. and 3. until the number I has reached a desired or predetermined number of bands or alternatively some criterion is fulfilled, see step 109 of flow-chart.

Step 3., the splitting operation, and the stopping criterion in step 4. can be implemented in different ways. For the splitting in step 3. examples of possible options are:
a) Bisection type of method: The band found to have the largest variance $\sigma^2$ is split into two equally large parts or close to equally large parts in the case where $K_i$ is odd.
b) Variance minimization method: The band found to have the largest variance $\sigma^2$ is split such that the sum of variances $\sigma_1^2+\sigma_2^2$ of the resulting two bands is minimized, where $\sigma_1^2$ and $\sigma_2^2$ denote the variances of the first and second band resulting from the split, respectively,
c) Spectral flatness maximization method: The band found to have the largest variance $\sigma^2$ is split such that the overall spectral flatness $flat_1+flat_2$ is maximized. The spectral flatness is defined as $$flat_i = \frac{\sqrt[K_i]{\prod_{k \in B_i} |H|^2[k]}}{\sum_{k \in B_i} |H|^2[k]/K_i} \tag{8}$$

d) Equivalent rectangular bandwidth (ERB) method: Divide the band with the highest variance such that the resulting bands are equal fractions of one ERB around their center frequency. The motivation for this method is that both bands are perceptually equally wide in this case. The ERB is e.g. defined in B. C. J. Moore, "An Introduction to the Psychology of Hearing", Academic Press, London, 1989, pages 105-109:

$$ERB(f)=0.108f+24.7 \tag{9}$$

where f is the center frequency of the band in Hz.

The different stopping criteria in step 4. are either related to the desired number of bands N or to some fidelity criterion. Examples of different fidelity criteria are
a) Maximum variance: Split bands until the maximum variance observed in any of the given bands is smaller than or equal to a threshold value
b) Minimum spectral flatness: Split bands until the minimum spectral flatness in any of the given bands is smaller than or equal to a threshold value.
c) Maximum fraction of ERB: Split bands until the maximum fraction of an ERB observed is smaller than or equal to a threshold value.

In the case where the splitting criterion in step 3. and the stopping criterion in step 4. are not matched, care has to be taken that the algorithm does not enter into an infinite loop. It is, for example, possible that a relatively wide band has reached zero variance and will never be split. However, the maximum fraction ERB criterion will not end the algorithm in this case.

Figure 10:
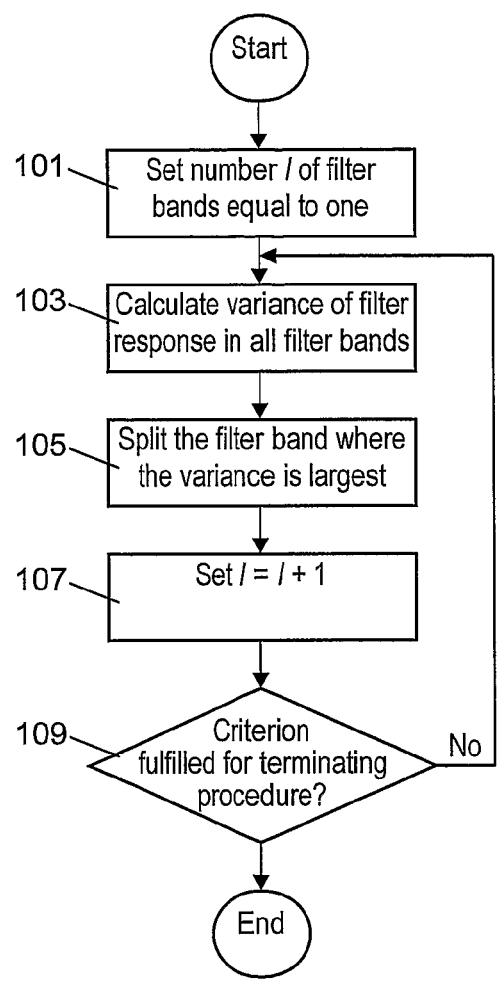
FIG. 10 is a flow-chart of a procedure for finding filter bands.

In the case where the same filter bands should be used for a set of filters, e.g. for the case of F cascaded filters described above or the sets of HRFs as described below, the algorithm depicted in FIG. 10 has to be modified to address all filters simultaneously. An example of such a modification is to change step 2. of the above iterative algorithm. The modification is then to find the variance $\sigma^2[i]$ as the maximum variance observed in that band:

$$\sigma^2[i] = \max_f \left( \frac{1}{K_i} \sum_{k \in B_i} H_f^2[k] - \frac{1}{K_i^2} \left( \sum_{k \in B_i} H_f[k] \right)^2 \right) \quad (10)$$

where $f \in \{1 \ldots F\}$ is the index of the filters involved.

After the splitting procedure has been terminated, new filter coefficients are calculated and the mapping between filters and filter bands are stored in a table. The new filter coefficients are calculated by e.g. minimizing an error criterion. If for example bands $k_1$ through $k_2$ are combined in one filter band a possible error criterion is $$\eta_i = \sum_{k=k_1}^{k_2} (H[k] - H_{red}[i])^2 \quad (11)$$

This error criterion is minimized by setting $$H_{red}[i] = \frac{\sum_{k=k_1}^{k_2} H[k]}{k_2 - k_1} \quad (12)$$

The above described adaptive filter representation can also be applied on the time domain impulse response or the coefficients of the difference equation (Eq. (1)).

Furthermore, the adaptive filter representation can be applied to time varying filters, either to find a resolution of the representation of the entire set of time varying filters or to find a resolution of the representation of each individual filter at a specific time.

In addition, the method can be applied to multi-dimensional filters used in e.g. image processing. In this case the impulse response of the filter is defined in several dimensions, i.e., the filter has a response $H[k_1, k_2, \ldots, k_D]$, where D is the number of dimensions. In this case groupings of coefficients can span different geometrical shapes, i.e. the coefficients $H[k_1 \in G_{k_1}[i], \ldots, k_D \in G_{k_D}[i]]$ are replaced by one single coefficient $H_{red}[i]$, where $G_{k_1}, \ldots G_{k_D}$ are the sets of coefficients $k_1, \ldots, k_D$ mapped onto the new coefficient i.

An example of the application of the method above for reduction to filter bands is the extension of the MPEG surround decoder, see e.g. the above cited text of ISO/EC 14496-3:200 X/PDAM 4, MPEG Surround N7530, October 2005, Nice, France.

Figure 1:
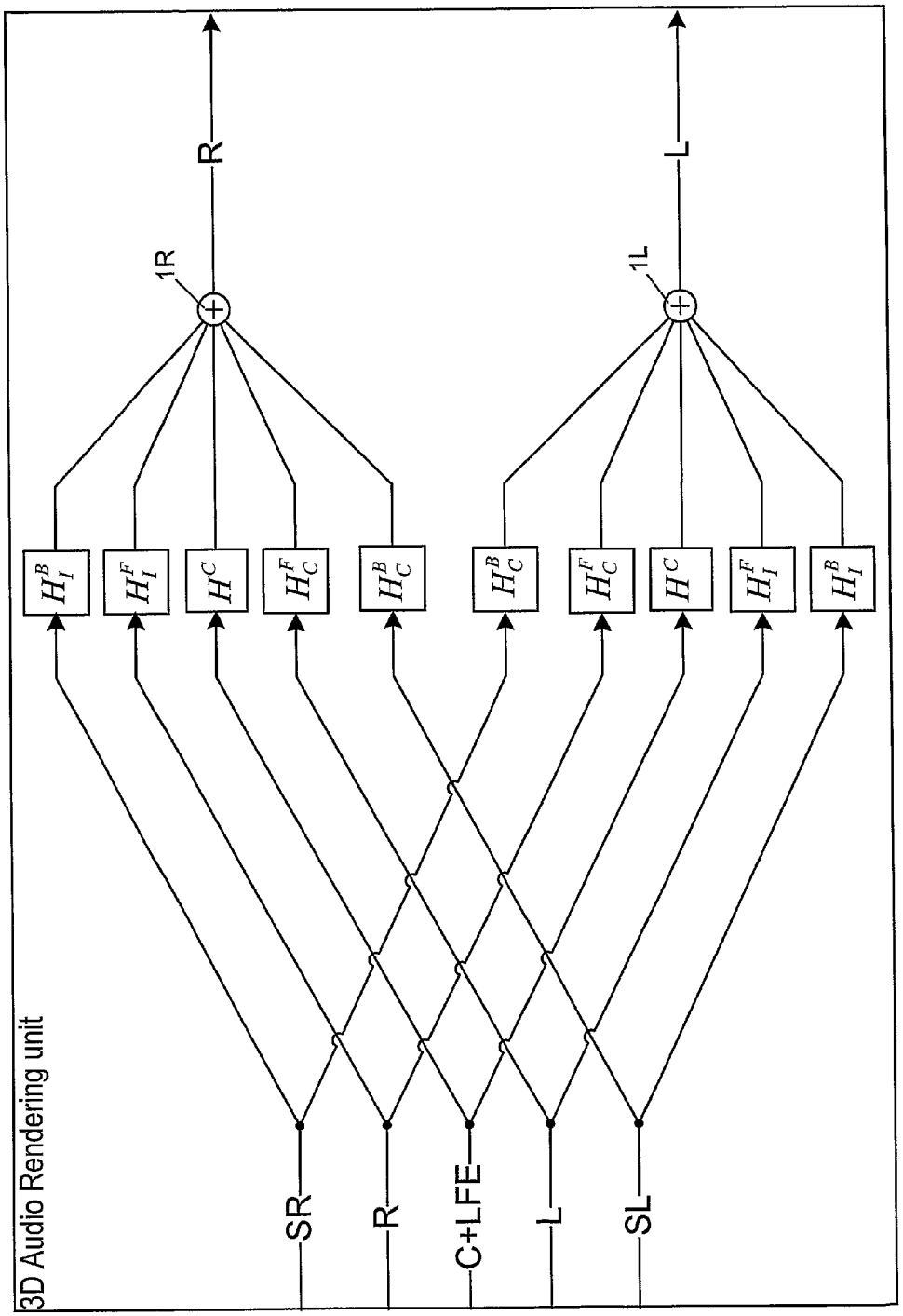
FIG. 1 is a block diagram illustrating a possible 3D audio or binaural rendering of a 5.1 audio signal.
Figure 2:
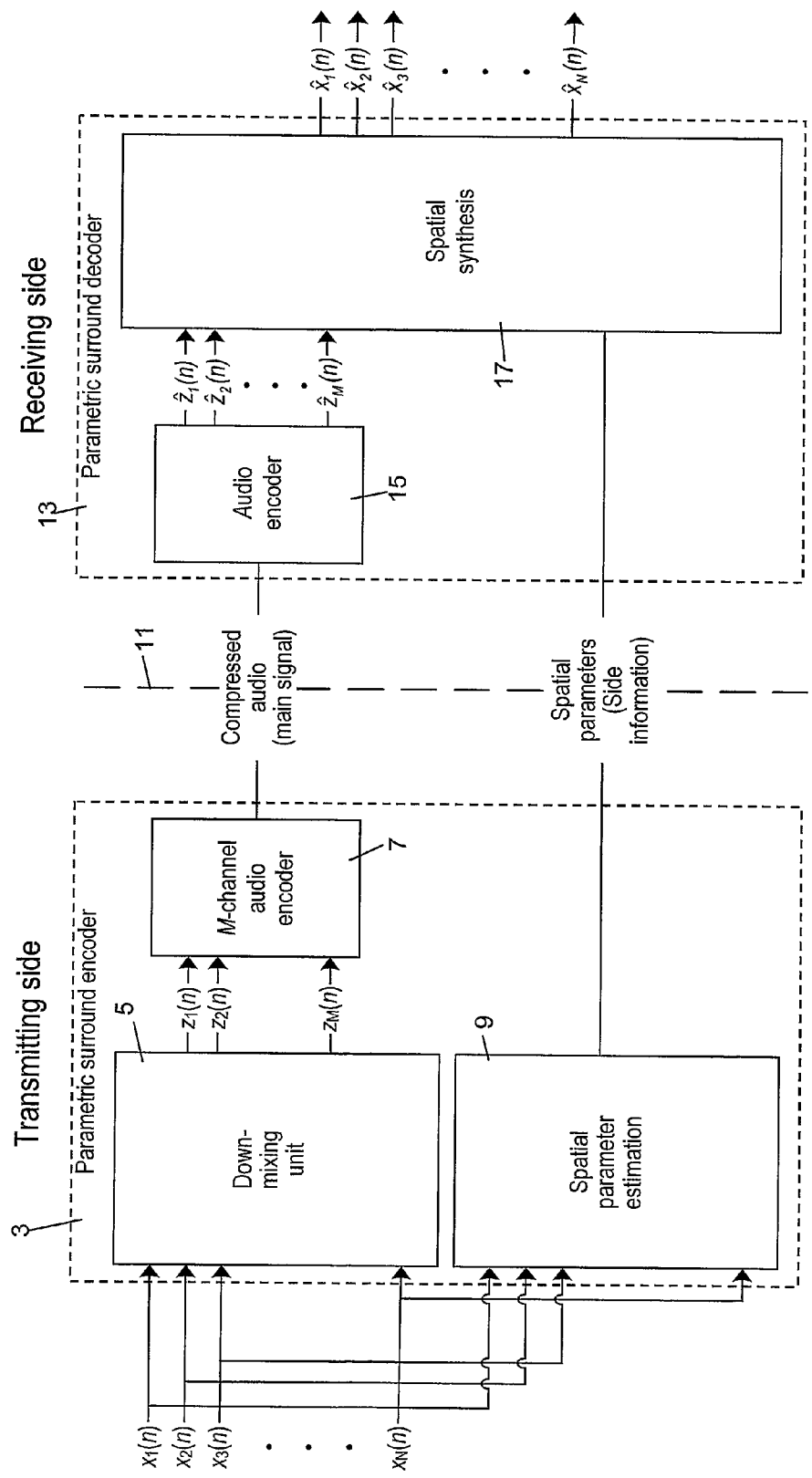
FIG. 2 is a high-level schematic illustrating the principles of a parametric multi-channel coding and decoding system.
Figure 3:
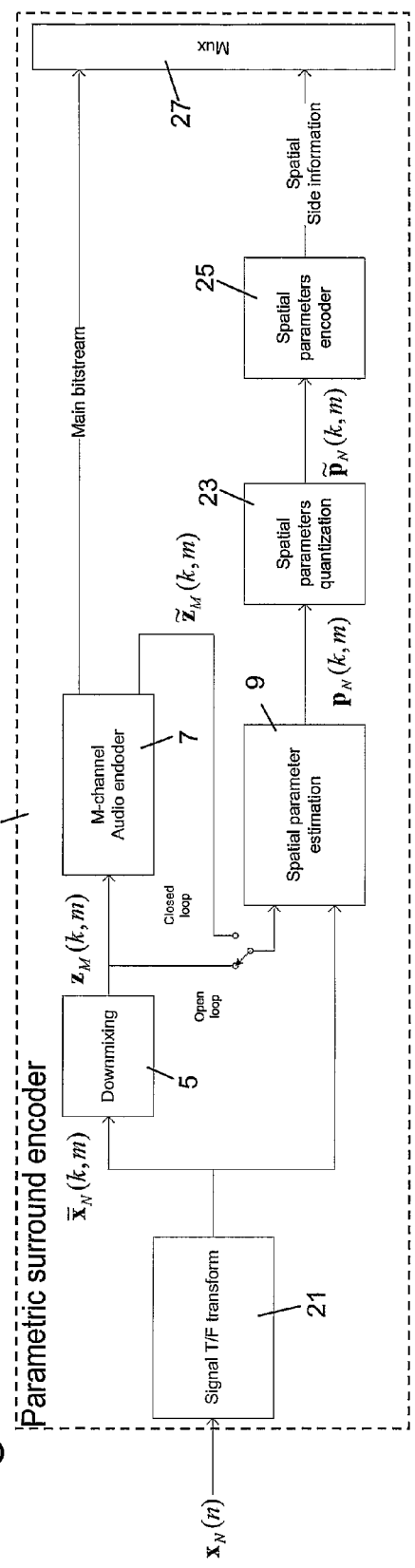
FIG. 3 is a more detailed schematic of a parametric multi-channel audio encoder
Figure 4:
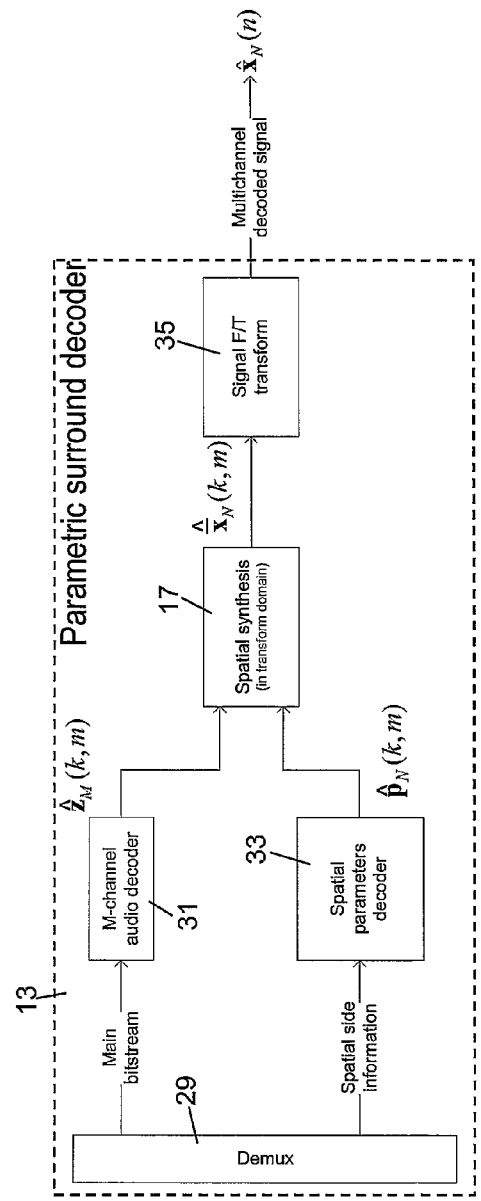
FIG. 4 is a more detailed schematic of a parametric multi-channel audio decoder.
Figure 5:
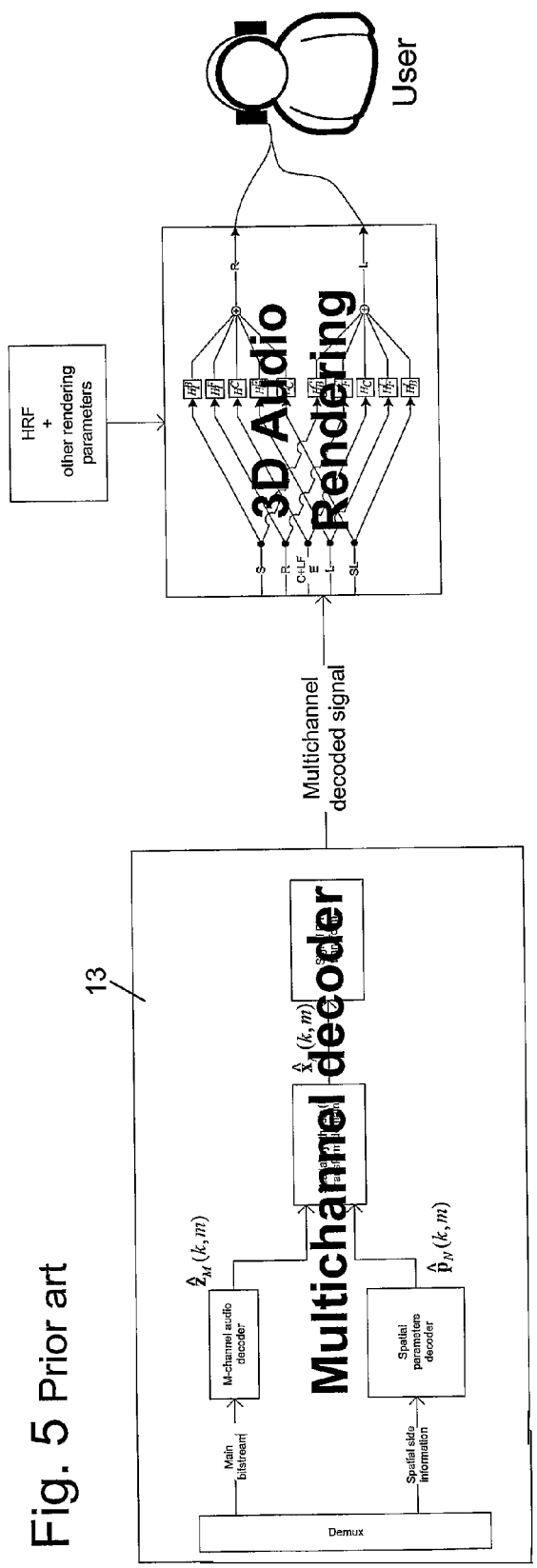
FIG. 5 is a schematic illustrating 3D-audio rendering of a decoded multi-channel signal.
Figure 12:
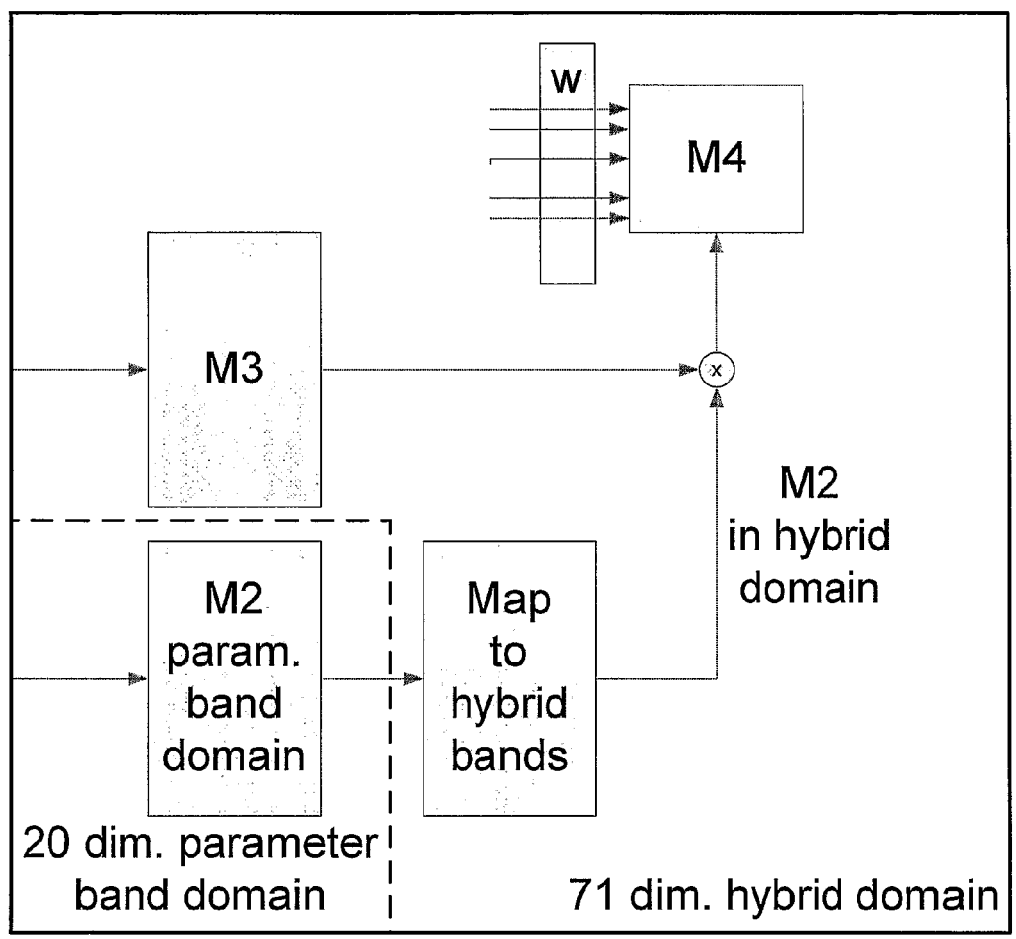
FIG. 12 is a schematic illustrating how a parameter modification matrix is combined with a mix matrix in the hybrid domain, not using binaural bands.

The signal processing part of an MPEG surround decoder as specified in the cited ISO/EC document operates on 71 hybrid bands whereas the parameters representing the spatialisation are transmitted to the decoder with a resolution of 20 parameter bands, compare e.g. block 17 in FIG. 4, for a parametric surround decoder, see also FIG. 12. The mapping from the parameter bands to the hybrid bands is given in Table A.30 of the above cited text and is not adaptive.

The frequency resolution of the hybrid domain with its 71 hybrid bands is unnecessary high for the representations of the HRFs. The HRFs of most listeners can be accurately represented using a lower resolution, i.e. the filters spanning the matrix $M_3^{n,k}$ in Eq. (4), can be represented in a domain with a lower frequency resolution. However, the resolution of the parameter bands is too coarse. The method of reducing to filter bands as described above may provide a way to find a non-uniform resolution adaptive to the characteristics of the HRFs.

The resulting frequency bands can be called binaural bands since the frequency resolution which they provide is sufficient to perform the binaural rendering with a high quality. To account for the presence of the parameter bands, the initialization of the algorithm described above is changed to setting the filter bands (binaural bands in this application) equal to the parameter bands. The parameter bands can thus be considered as an initial set of filter bands. In addition, when splitting the parameter bands the algorithm has to keep track of the mapping functions between parameter bands and binaural bands as well as between binaural bands and hybrid bands. It is found that I=30 binaural bands are sufficient to represent most of the investigated sets of HRFs.

The modified system provides three different frequency resolutions:

1. The parameter bands used to represent the coded spatial parameters that allow the derivation of the matrices $M_1^{n,k}$ and $M_2^{n,k}$ as described in the above cited ISO/EC document.
2. The binaural bands used to combine the mixing matrix $M_{2r}^{n,i}$ with the HRTFs in the parameter modification matrix $M_{3r}^{n,i}$. The HRTFs are stored in this resolution.
3. The hybrid bands used to perform the processing of the combined parameters with the signal matrix $w^{n,k}$ using the matrix $M_4^{n,k}$.

Figure 13:
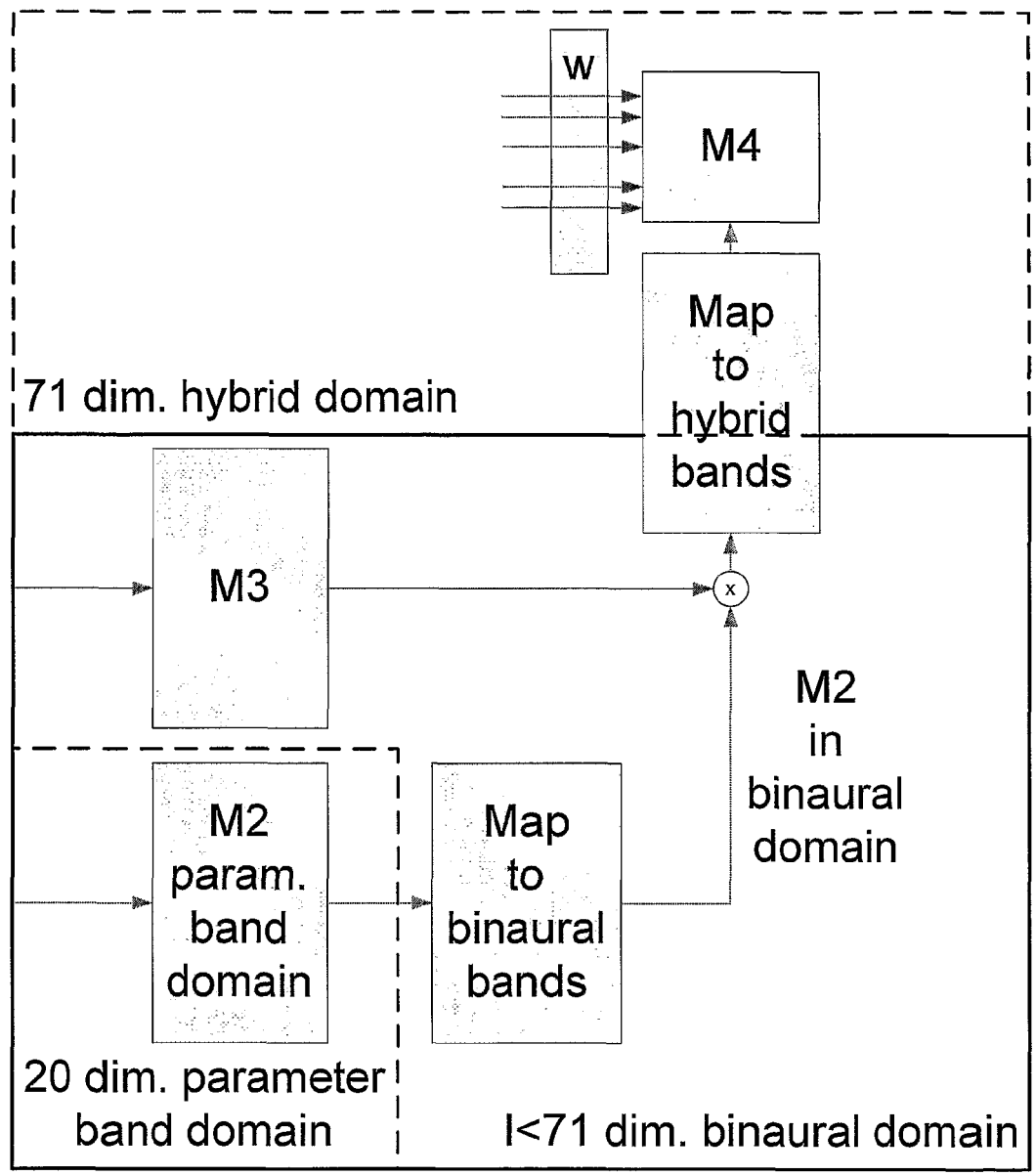
FIG. 13 is similar to FIG. 12 illustrating the case where binaural bands are used.
Figure 14:
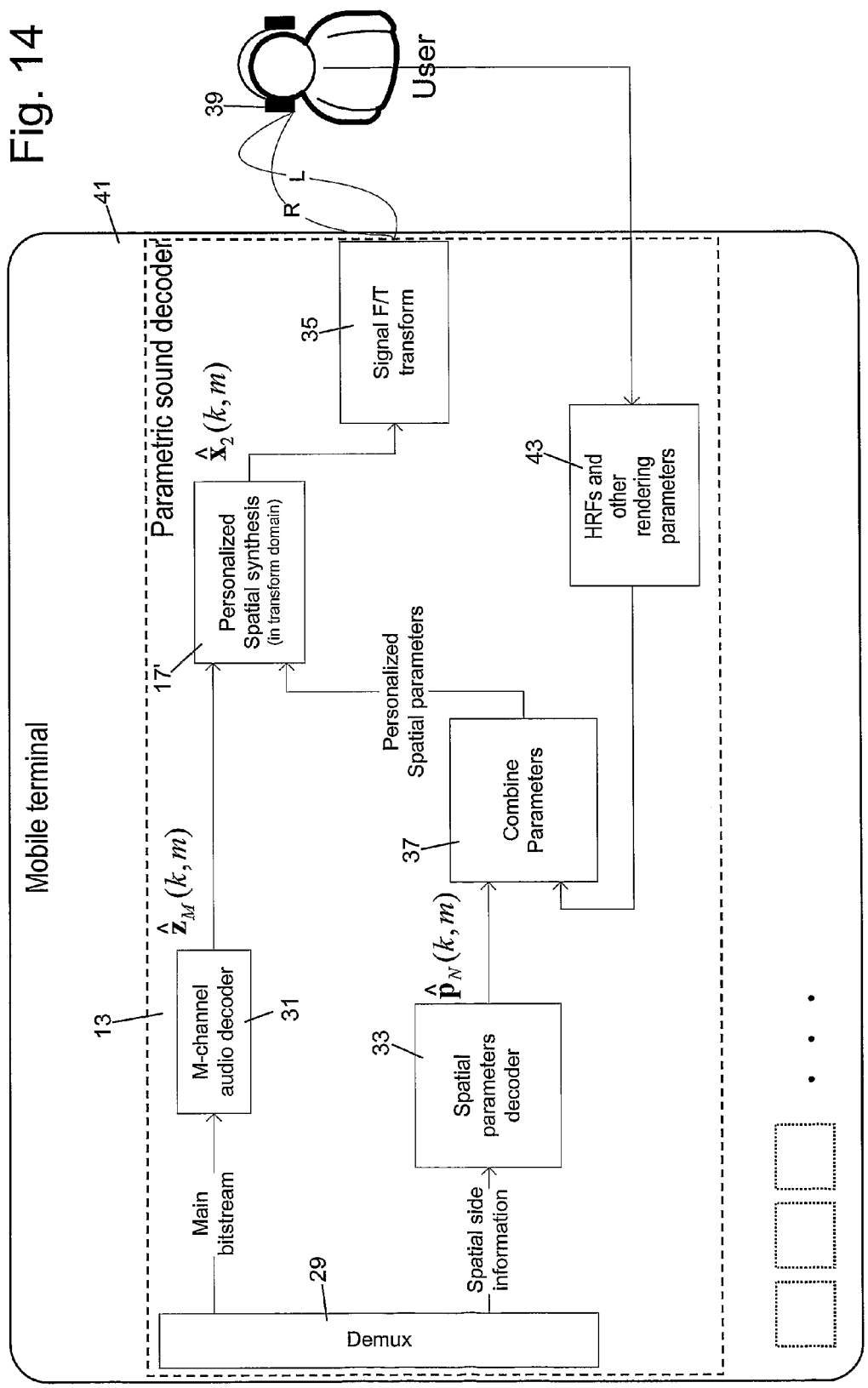
FIG. 14 is a schematic of an installation for personalized binaural decoding of multi-channel surround sound.
Figure 15:
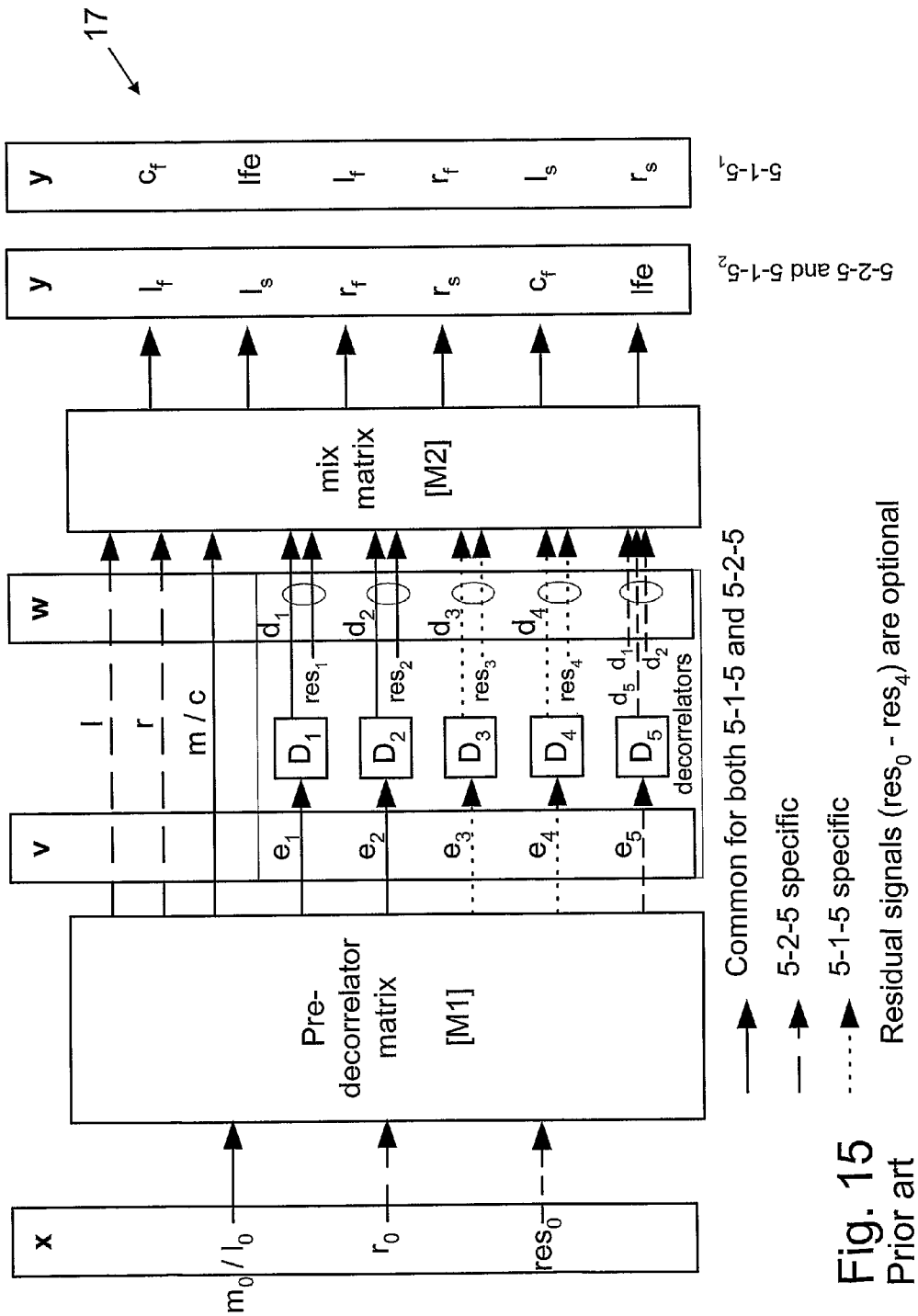
FIG. 15 is a general schematic illustrating spatial audio processing in an MPEG-surround decoder.
Figure 16:
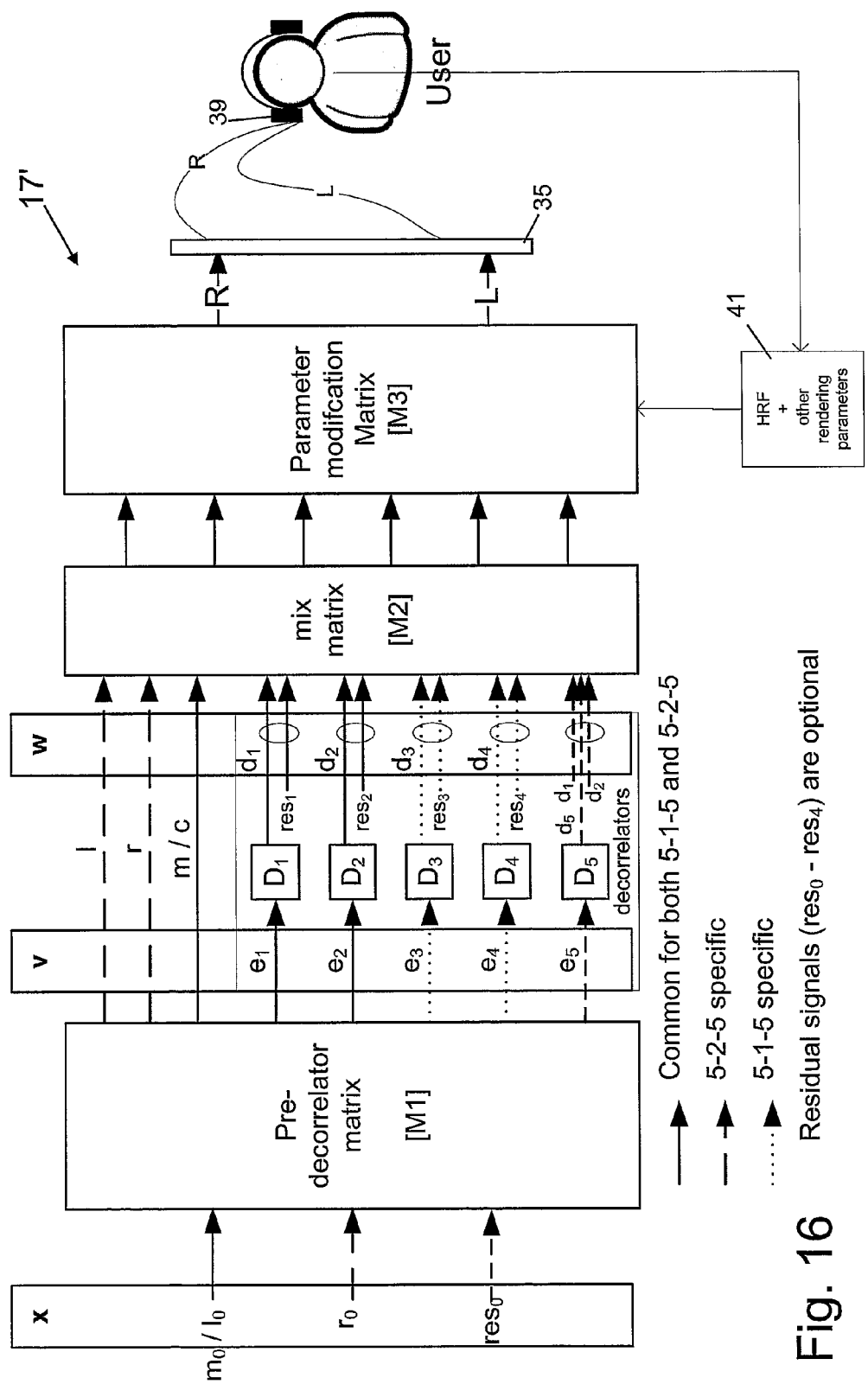
FIG. 16 is a schematic of a device for personalized binaural decoding.
Figure 17:
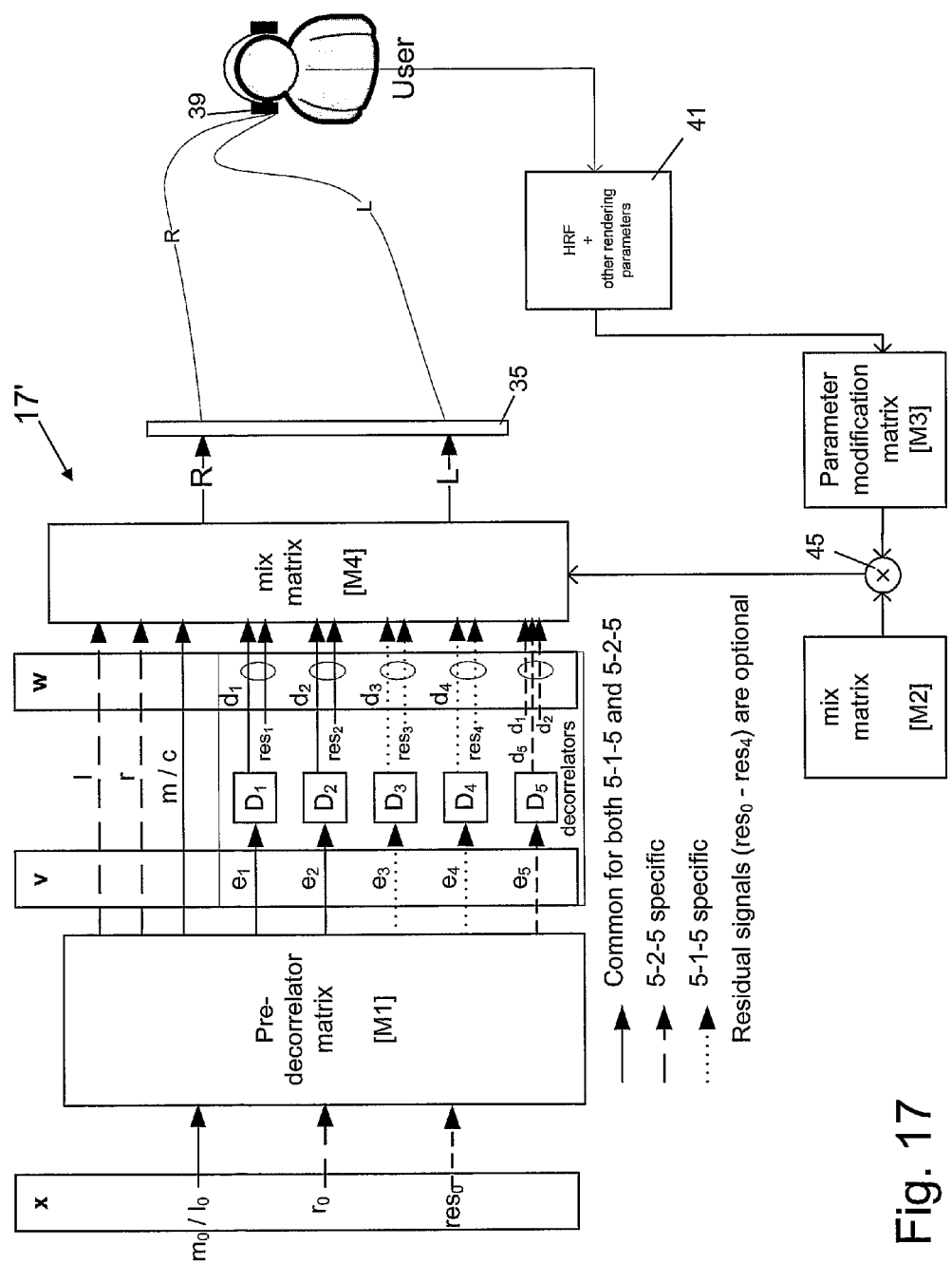
FIG. 17 is similar to FIG. 14 also illustrating how parameters are combined.

The resulting system is depicted in FIG. 13. It should be noted that the mapping functions are computationally simple since the parameters that enter into the mapping only are replicated into the different bands that result from the mapping.

Advantages of the invention may e.g. include:

1. The memory required to store a filter response or the response of a cascade of filters is reduced and adapted to the observed filter or cascade of filters.
2. The computational complexity to calculate a cascade of F filters is reduced from F·K multiplications to F·I multiplications where K is the resolution of the original transform and I<K is the resolution used in the method described herein.

Depending on the choices in the algorithm described above the quality of the filter representation for a given complexity and storage reduction is maximized. Alternatively, the required complexity and storage is minimized for a given fidelity of the filter representation.

In the example of binaural decoding in an MPEG Surround decoder a complexity and storage reduction by a factor 2.37, reducing the number of bands from K=71 to I=30, has been found. In addition, in this example the head related transfer functions are combined with parameters transmitted to the decoder into mix matrices that are multiplied by the signal. Introducing the representation of the HRTFs in binaural bands simplifies the calculation of these mix matrices. Instead of the calculation of K different matrices only I different matrices have to be calculated.

While specific embodiments of the invention have been illustrated and described herein, it is realized that numerous other embodiments may be envisaged and that numerous additional advantages, modifications and changes will readily occur to those skilled in the art without departing from the spirit and scope of the invention. Therefore, the invention in its broader aspects is not limited to the specific details, representative devices and illustrated examples shown and described herein. Accordingly, various modifications may be made without departing from the spirit or scope of the general inventive concept as defined by the appended claims and their equivalents. It is therefore to be understood that the appended claims are intended to cover all such modifications and changes as fall within a true spirit and scope of the invention. Numerous other embodiments may be envisaged without departing from the spirit and scope of the invention.

Acronym List:

AAC: Advanced Audio Coding
C: Center, one of six multi-channel signals in a 5.1 surround system
ERB: Equivalent rectangular bandwidth
FIR filter: Finite Impulse Response filter
HRF: Head Related Filter
HRTF: Head Related Transfer Function
MPEG: Moving Picture Experts Group
L: Left, one of six multi-channel signals in a 5.1 surround system
LFE: Low Frequency, one of six multi-channel signals in a 5.1 surround system
PDA: Personal Digital Assistant
R: Right, one of six multi-channel signals in a 5.1 surround system
SL: Surround Left, one of six multi-channel signals in a 5.1 surround system
SR: Surround Right, one of six multi-channel signals in a 5.1 surround system

The invention claimed is:

1. A method of processing an input signal including the successive steps of:
   providing the input signal to a digital filter represented by a set of filter coefficients, and
   filtering the input signal by the digital filter, wherein, before the step of filtering, said filter coefficients are expanded from a reduced digital filter represented by and stored as reduced filter coefficients and corresponding to an original digital filter, at least one of the reduced filter coefficients corresponding to or substantially agreeing with two of the filter coefficients in the original digital filter, the reduced digital filter obtained by the steps of:
   comparing the filter coefficients of the original digital filter to each other,
   combining, according to the result of the comparing, filter coefficients that are equal to each other or are sufficiently close to each other, to subsets of filter coefficients, each such subset represented by a reduced filter coefficient obtained from the filter coefficients in the subset.

2. A method according to claim 1 for the case where the original digital filter is a product of a plurality of element original digital filters, wherein in the step of comparing, the filter coefficients of each of the element digital filters are compared to each other and in the step of combining, filter coefficients of each of the element digital filters that are equal to each other or are sufficiently close to each other are combined to subsets, each such subset represented by a reduced filter coefficient obtained from the filter coefficients in the subset and the subsets of the sets of filter coefficients for all element digital filters are equal to each other.

3. A method according to claim 1, wherein the input signal is a time-dependent signal and the filtering coefficients are associated with distinct frequencies.

4. A method according to claim 3, wherein, in the step of comparing, filter coefficients of the original digital filter for adjacents frequencies are compared, so that, in the step of combining, only filter coefficients for adjacents frequencies are combined and the subset or subsets formed each spanning a distinct frequency band.

5. A method according to claim 1, wherein the set of filter coefficients representing the original digital filter is the frequency impulse response of the original digital filter.

6. A method according to claim 1, wherein the set of filter coefficients representing the original digital filter is the time impulse response of the digital filter.

7. A method according to claim 1, wherein the set of filter coefficients representing the, original digital filter is a set of coefficients of a difference equation characterizing the digital filter.

8. A method according to claim 1, wherein in the step of comparing the filter coefficients, the variances of subsets of the coefficients representing the original digital filter are compared.

9. A method according to claim 1, wherein the steps of comparing and combining include:
   initializing the number of subsets to be equal to one, the initial subset including all the coefficients representing the original digital filter,
   determining the variance of the coefficients in all subsets of the original digital filter,
   splitting the subset for which the variance is largest in two parts and increase the number of subsets by one, and
   repeating the determining and splitting steps a stopping criterion is fulfilled.

10. A method according to claim 9, wherein in the splitting step, the subset found to have the largest variance is split into two equally large parts or as close to equally large as possible.

11. A method according to claim 9, wherein in the splitting step, the subset found to have the largest variance is split such that the sum of variances of the two subset resulting from the splitting is minimized.

12. A method according to claim 9, wherein in the splitting step, the subset found to have the largest variance is split such that the sum of the spectral flatnesses of the two subset resulting from the splitting is maximized.

13. A method according to claim 9, wherein in the splitting step, the subset found to have the largest variance is split such that the resulting subsets are equal fractions of one equivalent rectangular bandwidth (ERB) around their center frequency.

14. A method according to claim 9, wherein the determining and splitting steps are repeated until the number of subsets has reached a predetermined number.

15. A method according to claim 9, wherein the determining and splitting steps are repeated until the maximum variance observed in any of the resulting subsets is smaller than or equal to a threshold value.

16. A method according to claim 9, wherein the determining and splitting steps are repeated until the minimum spectral flatness in any of the resulting subsets bands is smaller than or equal to a threshold value.

17. A method according to claim 9, wherein the determining and splitting steps are repeated until the maximum fraction of an equivalent rectangular bandwidth (ERB) in a resulting subset is smaller than or equal to a threshold value.

18. A device for processing an input signal including:
- a memory place for storing reduced filter coefficients of a reduced digital filter,
- a memory place for storing a table mapping the reduced filter coefficients to filter coefficients of an original digital filter,
- logical unit for expanding the reduced filter coefficients to form actual filter coefficients that are equal to or substantially agrees with the filter coefficients of the original digital filter, and
- a filtering unit for filtering the input signal using the actual filter coefficients.

19. A device according to claim 18, wherein at least one of the reduced filter coefficients correspond to at least two filter coefficients of the original digital filter, the memory place required for storing the reduced filter coefficients hence being smaller than that required for storing the filter coefficients of the original digital filter.

20. A method of processing an input time domain signal including the successive steps of:
- transforming the input signal to the frequency time to give a transformed input signal, and
- filtering in a filter the transformed input signal by multiplying the amplitudes of frequency components in the transformed signal by coefficients of the frequency-domain impulse response of the filter, wherein the coefficients are derived from a reduced set of coefficients, at least one of the coefficients in the reduced set representing the filter response in a frequency band covering at least two adjacent frequencies used in the transforming.

21. A method of storing filter coefficients representing an original digital filter represented by original filter coefficients including the successive steps of:
- comparing the original filter coefficients to each other,
- combining, according to the result of the comparing, filter coefficients that are equal to each other or are sufficiently close to each other, to subsets of filter coefficients, each such subset represented by a reduced filter coefficient obtained from the filter coefficients in the subset, and
- storing the reduced filter coefficients and a table mapping the subsets to the original filter coefficients.

22. A method according to claim 21 in the case where the filter coefficients are associated with distinct frequencies, wherein, in the step of comparing, filter coefficients of the original digital filter for adjacents frequencies are compared, so that, in the step of combining, only filter coefficients for adjacents frequencies are combined and each of the subset or subsets formed spans a distinct frequency band.

* * * * *

UNITED STATES PATENT AND TRADEMARK OFFICE
CERTIFICATE OF CORRECTION

PATENT NO. : 8,266,195 B2  Page 1 of 1
APPLICATION NO. : 12/295110
DATED : September 11, 2012
INVENTOR(S) : Taleb et al.

It is certified that error appears in the above-identified patent and that said Letters Patent is hereby corrected as shown below:

On the Title Page, in Item (57), under "ABSTRACT", in Column 2, Line 2, delete "characteristics If" and insert -- characteristics. If --, therefor.

In The Specification

In Column 2, Lines 58-59, delete "(AC-3 codes)" and insert -- (AC-3 codec) --, therefor.

In Column 6, Line 32, delete "$M_{2p}^{n,j}$," and insert -- $M_{2p}^{n,i}$, --, therefor.

In Column 6, Line 35, delete "indices" and insert -- indices i --, therefor.

In The Claims

In Column 14, Line 20, in Claim 7, delete "the," and insert -- the --, therefor.

Signed and Sealed this
Nineteenth Day of April, 2016

Michelle K. Lee
*Director of the United States Patent and Trademark Office*